(12) United States Patent
Chen et al.

(10) Patent No.: US 8,237,160 B2
(45) Date of Patent: Aug. 7, 2012

(54) PROBE PAD ON A CORNER STRESS RELIEF REGION IN A SEMICONDUCTOR CHIP

(75) Inventors: Hsien-Wei Chen, Sinying (TW);
Chung-Ying Yang, Taoyuan (TW);
Ying-Ju Chen, Tuku Township (TW);
Shih-Wei Liang, Dajia Township (TW);
Ching-Jung Yang, Pingzhen (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/198,408

(22) Filed: Aug. 4, 2011

(65) Prior Publication Data

US 2011/0284843 A1 Nov. 24, 2011

Related U.S. Application Data

(63) Continuation-in-part of application No. 11/801,529, filed on May 10, 2007.

(51) Int. Cl.
*H01L 23/58* (2006.01)
(52) U.S. Cl. .................... 257/48; 257/E21.521
(58) Field of Classification Search .............. 257/48–49, 257/E21.521–E21.524
See application file for complete search history.

(56) References Cited

U.S. PATENT DOCUMENTS

| | | | |
|---|---|---|---|
| 5,942,766 A * | 8/1999 | Frei ................................. | 257/48 |
| 6,300,223 B1 | 10/2001 | Chang et al. | |
| 6,621,285 B1 | 9/2003 | Yatsu | |
| 7,253,487 B2 | 8/2007 | Chen | |
| 7,256,475 B2 * | 8/2007 | Jao et al. ........................ | 257/622 |
| 7,265,436 B2 * | 9/2007 | Huang et al. ................... | 257/620 |
| 7,307,441 B2 | 12/2007 | Sohn et al. | |
| 7,400,134 B2 | 7/2008 | Morishita et al. | |
| 7,482,675 B2 * | 1/2009 | Adkisson et al. ............. | 257/620 |
| 7,566,915 B2 | 7/2009 | Chang et al. | |
| 7,679,384 B2 | 3/2010 | Chen et al. | |
| 2004/0150070 A1 | 8/2004 | Okada et al. | |
| 2005/0098893 A1 | 5/2005 | Tsutsue et al. | |
| 2005/0263855 A1 | 12/2005 | Fu et al. | |
| 2006/0001165 A1 | 1/2006 | Tokitoh et al. | |
| 2006/0109014 A1 | 5/2006 | Chao et al. | |
| 2007/0077666 A1 | 4/2007 | Sogawa | |
| 2007/0187845 A1 | 8/2007 | Fu et al. | |
| 2008/0191205 A1 | 8/2008 | Tsai et al. | |
| 2008/0224135 A1 * | 9/2008 | Filippi et al. .................... | 257/48 |
| 2008/0277659 A1 | 11/2008 | Hsu et al. | |
| 2008/0290340 A1 * | 11/2008 | West ............................... | 257/48 |
| 2010/0078769 A1 | 4/2010 | West et al. | |
| 2011/0266541 A1 | 11/2011 | Yang et al. | |

* cited by examiner

*Primary Examiner* — Kiesha Bryant
*Assistant Examiner* — Ali Naraghi
(74) *Attorney, Agent, or Firm* — Slater & Matsil, L.L.P.

(57) ABSTRACT

A semiconductor chip includes a corner stress relief (CSR) region. An enhanced structure connects sides of a seal ring structure to surround the CSR region. A device under test (DUT) structure is disposed on the CSR region. A set of probe pad structures is disposed on the CSR region. Two of the set of probe pad structures are electrically connect to the DUT structure.

20 Claims, 4 Drawing Sheets

US 8,237,160 B2

PROBE PAD ON A CORNER STRESS RELIEF REGION IN A SEMICONDUCTOR CHIP

This application is a continuation-in-part of U.S. patent application Ser. No. 11/801,529, filed on May 10, 2007, entitled "Test Structure for Semiconductor Chip" which application is hereby incorporated herein by reference. This application is related to U.S. patent application Ser. No. 13/180,304, filed on Jul. 11, 2011, entitled "Probe Pad on a Corner Stress Relief Region in a Semiconductor Chip," which application is also hereby incorporated herein by reference.

TECHNICAL FIELD

The disclosure relates generally to semiconductor chip designs and, more particularly, to a semiconductor chip having a probe pad on a corner stress relief region in the semiconductor chip.

BACKGROUND

In integrated circuit (IC) manufacturing, a semiconductor wafer typically contains a plurality of testlines in the scribe line region between adjacent semiconductor chips. Each testline includes a plurality of probe pads connected to a number of devices under test (DUTs), which are structures similar to those that are normally used in the integrated circuit products in the circuit region. DUTs are usually formed in the scribe line regions on a testline at the same time as the functional circuits using the same process steps. Probe pads are usually flat, square metal surfaces on a testline through which test stimuli can be applied to corresponding DUTs. Parametric test results on DUTs are usually utilized to monitor, improve and refine a semiconductor manufacturing process. Yield of test structures on a testline is often used to predict the yield of functional integrated circuits in the circuit region.

After manufacturing, the semiconductor wafer is sawed from the scribe line regions to separate the semiconductor chips, so that each of the semiconductor chips may be packaged individually. Therefore, the probe pads and DUTs in the scribe line regions are destroyed. After the dicing process, it is not possible to perform parametric tests on DUTs to predict the yield of functional integrated circuits in the circuit regions. The yield of individual semiconductor chips after dicing cannot be accurately controlled.

BRIEF DESCRIPTION OF THE DRAWINGS

Exemplary embodiments will be described with reference to the accompanying figures. It should be understood that the drawings are for illustrative purposes and are therefore not drawn to scale.

DETAILED DESCRIPTION

It is to be understood that the following disclosure provides many different embodiments, or examples, for implementing different features of the invention. Specific examples of components and arrangements are described below to simplify the present disclosure. These are, of course, merely examples and are not intended to be limiting. Moreover, the formation of a first feature over, above, or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn to different scales for simplicity and clarity.

A plurality of semiconductor chip regions is marked on the semiconductor substrate by scribe lines between the chip regions. The semiconductor substrate will go through a variety of cleaning, layering, patterning, etching and doping steps to form integrated circuits. The term "semiconductor substrate" herein generally refers to the semiconductor bulk substrate on which various layers and device structures may be formed. In some embodiments, the semiconductor bulk substrate includes silicon or a compound semiconductor, such as GaAs, InP, Si/Ge, or SiC. Examples of such layers include dielectric layers, doped layers, polysilicon layers or conductive layers. Examples of device structures include transistors, resistors, and/or capacitors, which may be interconnected through an interconnect layer to additional integrated circuits.

Figure 1:
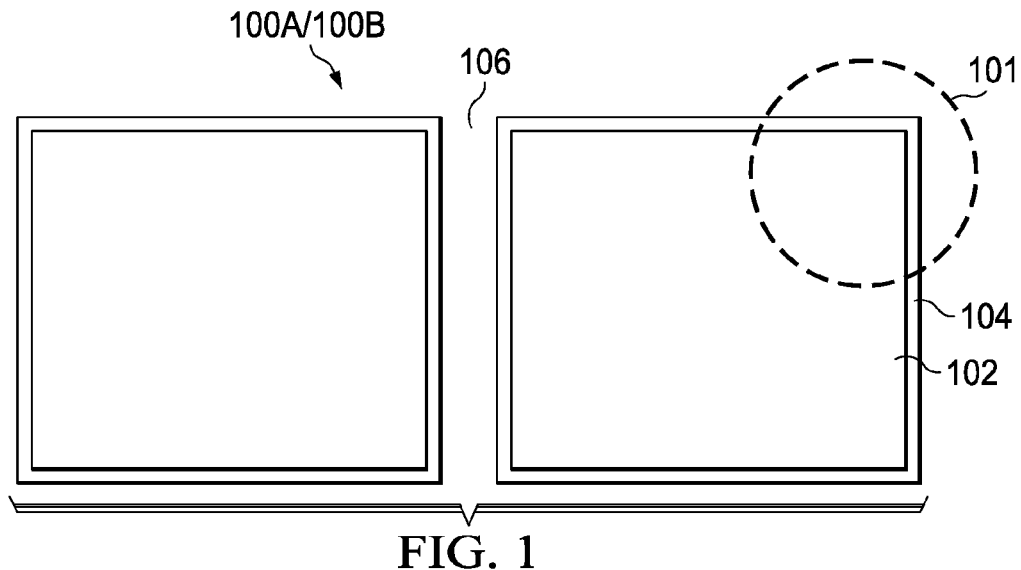
FIG. 1 is a top view of two semiconductor chips with seal ring structures according to various aspects of the present disclosure.

FIG. 1 is a top view of two semiconductor chips with seal ring structures according to various aspects of the present disclosure. A semiconductor chip 100A or 100B includes a circuit region 102, a seal ring region 104 and a scribe line region 106. The seal ring region 104 and the scribe line region 106 surrounds the circuit region 102. The seal ring region 104 is for forming a seal ring structure thereon and the circuit region 102 is for forming a plurality of functional circuits having at least a device structure as previously described. The functional circuits are capable of operating the plurality of semiconductor device structures as previously described in the semiconductor chip 100A. The seal ring structure surrounds the circuit region 102 to protect the functional circuits in the circuit region 102 from moisture degradation, ionic contamination, and damage during dicing and packaging processes.

Figure 2:
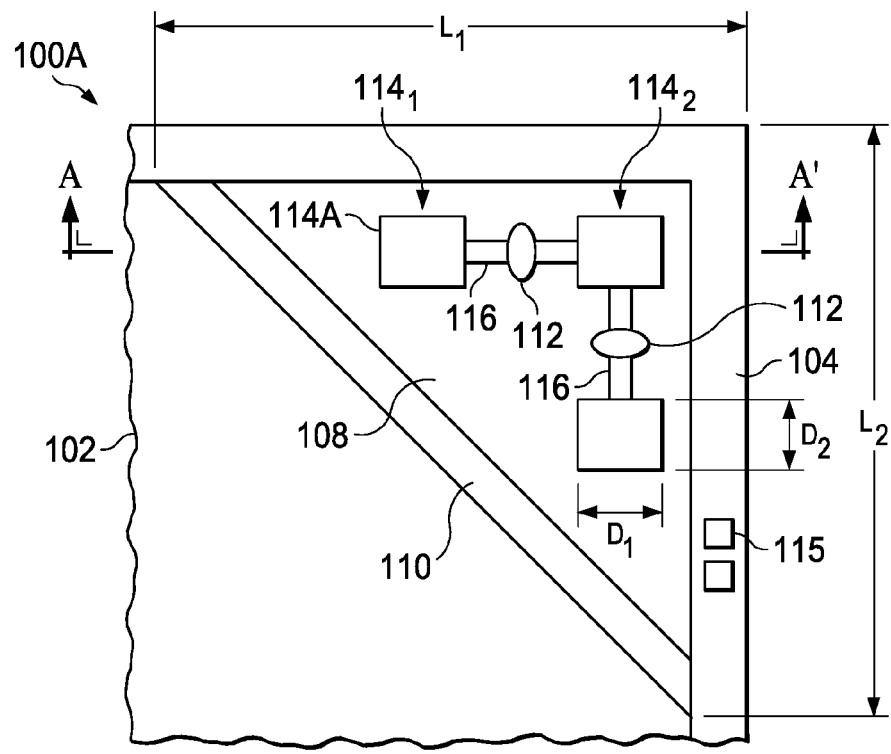
FIG. 2 is an enlarged view of a portion of the semiconductor chip depicted in FIG. 1.

FIG. 2 is an enlarged view of a portion 101 of the semiconductor chip 100A depicted in FIG. 1. The semiconductor chip 100A includes the circuit region 102, a corner stress relief (CSR) region 108 and the seal ring region 104. The seal ring region 104 having a seal ring structure surrounds the circuit region 102 and the CSR region 108. The CSR region 108 is in a corner of the semiconductor chip 100A. The CSR region 108 may be designed on the chip 100A to prevent cracking of the chip induced by stress from backend processing such as die-sawing, packing, and plastic molding. The functional circuits are excluded from the CSR region 108 because it is a region that may experience greater stress during and after backend processing. In one embodiment, the CSR region 108 occupies a substantially right triangular area having perpendicular edges, the perpendicular edges having lengths of L1 and L2, respectively. The lengths L1 and L1 are within a range from about 30 µm to about 100 µm.

The semiconductor chip 100A further includes a plurality of stacked metal features and via pillars disposed in the semiconductor chip 100A. The circuit region 102 comprises a first portion of the plurality of stacked metal features and via pillars, which are referred to as interconnects, to electrically connect the plurality of functional circuits. The seal ring structure comprises a second portion of the plurality of stacked metal features and via pillars to protect the circuit region 102. A third portion of the plurality of stacked metal features and via pillars form various probe pad structures which will be discussed in more detailed later. In some embodiments, the seal ring structure and probe pad structures are constructed simultaneously with the construction of interconnects (not shown) in the circuit region 102. The stacked metal features and via pillars are disposed within one or more dielectric layers.

The semiconductor chip 100A further includes an enhanced structure 110 formed between the circuit region 102 and the CSR region 108, as shown in FIG. 2. The enhanced structure 110 connects sides of the seal ring structure to surround the CSR region 108. The enhanced structure 110 is additional stacked metal features and via pillars that are formed simultaneously with the formation of the seal ring structure, and physically join the seal ring structure. It is believed that the corner region has greater stress than other regions of the semiconductor chip 100A. With the formation of the enhanced structure 110, more metal structures exist at the corner region. The stress applied to the seal ring structure may thus be spread to more metal structures, and hence the seal ring structure is less likely to be damaged by stresses.

The semiconductor chip 100A further includes a plurality of device under test (DUT) structures 112 disposed in the CSR region 108. According to some embodiments, the DUT structures 112 are test structures in the form of resistors, capacitors, inductors, diodes, transistors, or the like, designed to measure device parameters, such as MOSFET threshold voltage (Vt), contact/via chain resistance, sheet capacitance, gate oxide breakdown voltage, and the like. By studying these parameters, it is possible to monitor, improve and refine a semiconductor production process.

Figure 3:
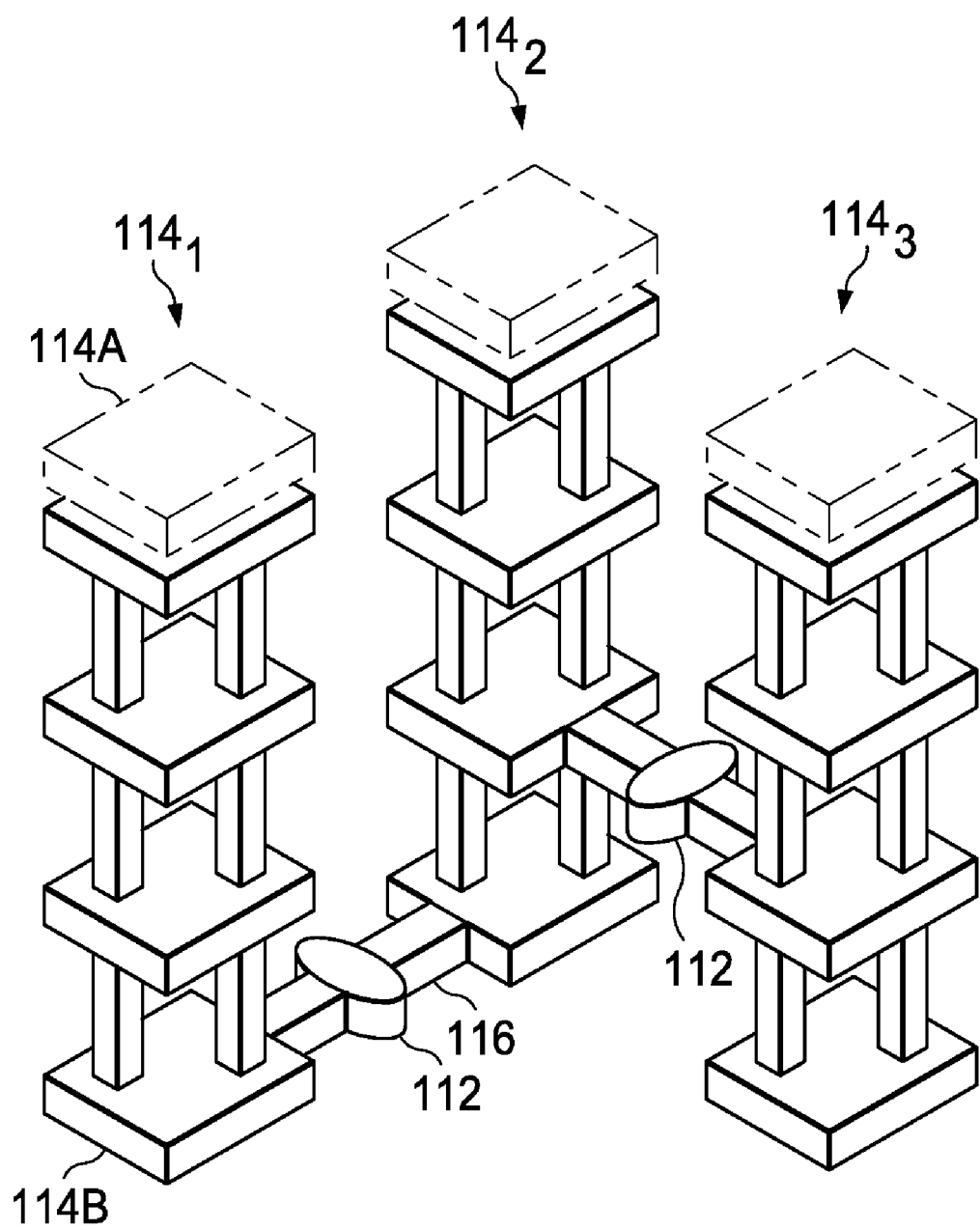
FIG. 3 is a perspective view of a plurality of probe pad structures.

The semiconductor chip 100A includes a set of probe pad structures $114_1$-$114_3$ disposed on the CSR region 108. Every two of the set of probe pad structures $114_1$-$114_3$ electrically connect to one of the DUT structures 112. Each probe pad structure $114_1$-$114_3$ comprises a plurality of stacked metal features 114B and via pillars, as shown in FIG. 3. Each of the metal features 114B is also referred to as a first probe pad 114B. In the CSR region 108, the semiconductor chip 100A further includes a metal line 116 connecting to the DUT structure 112. The metal line 116 is in a same metallization layer of one of the two probe pad structures $114_1$-$114_3$ connecting to the DUT structure 112. The metal line 116 electrically connects the DUT structure 112 and the first probe pad 114B. The metal line 116 enables the previously described measurement of the DUT structures 112 through the first probe pad 114B. Each probe pad structures $114_1$-$114_3$ may further include a top first probe pad 114A aligned over the other probe pads 114B. The top first probe pad 114A provides the function for the measurement of the DUT structure 112 for the semiconductor chip 100A when all the semiconductor fabrication processes are completed in the wafer form. The top first probe pad 114A also enables performance of parametric tests on DUTs after dicing the semiconductor chip 100A from the wafer. Advantageously, the configuration of the stacked metal features 114B (also is referred to as the first probe pad 114B) and via pillars for the probe pad structure $114_1$-$114_3$ enables the measurement of the DUT structure 112 for each metallization layer or dielectric layer when that layer is completed.

Each of the top first probe pad 114A and the first probe pads 114B occupies a substantially rectangular area having edges, each long edge having a length D1 and each short edge having a length D2, respectively. In one embodiment, the lengths D1 and D2 are within a range from about 10 μm to about 20 μm. The lengths D1 and D2 are within a ratio from about 20% to about 50% of the lengths L1 and L2 of the CSR region 108. Advantageously, the lengths D1 and D2 of the first probe pad 114B (also top first probe pad 114A) and the ratio of lengths D1/D2 to lengths L1/L2 in the above ranges keep enough operational space for test stimuli in the CSR region 108 without consuming extra space for functional integrated circuits in the circuit region 102. In some embodiments, D1 may be equal to D2.

In one embodiment, the set of probe pad structure $114_1$-$114_3$ comprises at least two probe pad structures. In the measurement of device parameters, a current from a current source may pass through test stimuli connected to the two probe pad structures. The device parameters of the DUT structures 112 connected to the two probe pad structures could be measured. In another embodiment, the set of probe pad structures $114_1$-$114_3$ may comprise three probe pad structures disposed on the CSR region 108. Combinations of measurements are performed to collect as much information as possible regarding the set of probe pad structures $114_1$-$114_3$ and the DUT structures 112 between them. In one embodiment, a configuration of the stacked metal features 114B (also referred to as the first probe pad 114B) and via pillars for the probe pad structure $114_1$-$114_3$ enables the same probe pad structure $114_2$ connect to different DUTs 112 in different metallization layers as shown in FIG. 3. Advantageously, this stacking configuration accommodates more DUTs 112 with different functions in the CSR region 108. The probe pad structure could effectively use the space in the CSR region 108 without consuming extra space for functional circuits in the circuit region 102.

In another embodiment, a second set of probe pads 115 (see FIG. 2) is disposed on the seal ring region 104. The second set of probe pads 115 are electrically connected to the DUT structures 112. Each of the second set of probe pads 115 occupies a substantially rectangular area having edges. Each edge has a length less than a width of the seal ring structure in the seal ring region 104. The second set of probe pads 115 are superimposed on the seal ring structure or are the top portion of the seal ring structure. The second set of probe pads 115 do not reduce the integrity of the seal ring structure to protect the integrated circuits from moisture degradation, ionic contamination, and damage during dicing and packaging processes.

Figure 4:
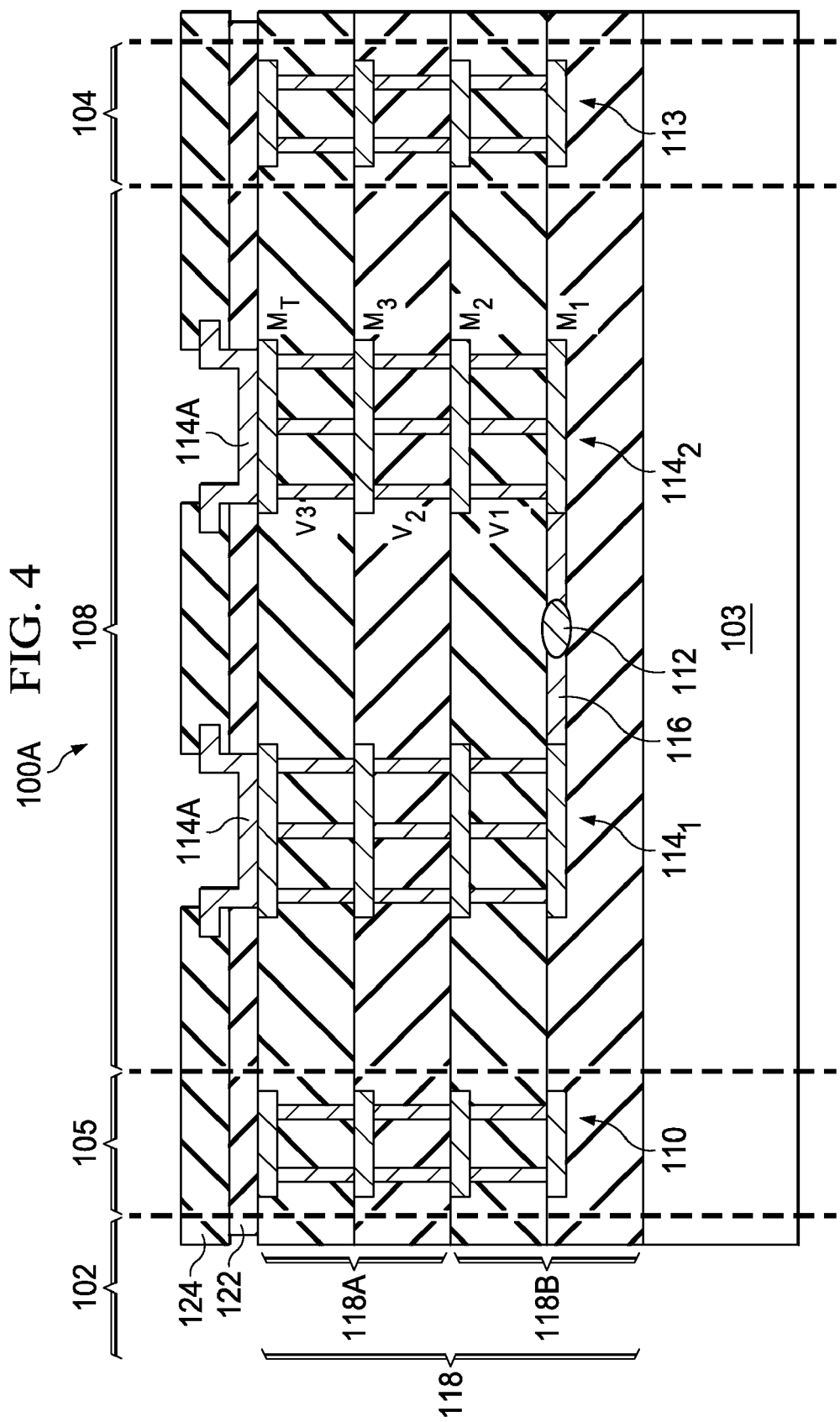
FIG. 4 is a cross-sectional view along line A-A' in FIG. 2 of the portion of the semiconductor chip of the present disclosure.

FIG. 4 illustrates one embodiment of a cross-sectional view obtained from the vertical plane crossing line A-A' in FIG. 2. The semiconductor chip 100A may include a semiconductor substrate 103 having the circuit region 102, an enhanced region 105, the CSR region 108 and the seal ring region 104. The seal ring region 104 has a seal ring structure 113 surrounding the circuit region 102, the enhanced region 105 and the CSR region 108. The enhanced region 105 having the enhanced structure 110 is disposed between the circuit region 102 and the CSR region 108. The semiconductor substrate 103 may include silicon or a compound semiconductor, such as GaAs, InP, Si/Ge, or SiC. The substrate 103 may further include doped regions, such as a P-well, an N-well, and/or a doped active region such as a P+ doped active region.

The semiconductor chip 100A may further include isolation structures, such as shallow trench isolation (STI) features or LOCOS features (not shown) formed in the substrate 103 for isolating circuits from other regions in the substrate. The semiconductor chip 100A may further include device structures such as transistors, resistors, and/or capacitors (not shown) overlying the substrate 103.

The semiconductor chip 100A includes multiple dielectric layers 118 disposed over the substrate 103. In some embodiments, the dielectric layers 118 are formed of low-k dielectric materials with dielectric constants (k values) between about 2.9 and 3.8, ultra low-k (ULK) dielectric materials with k values between about 2.5 and about 2.9, oxide, undoped silicate glass (USG), or silicon dioxide ($SiO_2$). Typically the lower k value a dielectric layer 118 has, the more fragile and prone to delamination and cracking the layer becomes. In some embodiments, multiple dielectric layers 118 comprise top-level dielectric layers 118A and bottom-level dielectric layers 118B. A dielectric constant of the bottom-level dielectric layer(s) 118B is less than a dielectric constant of the top-level dielectric layer(s) 118A. The top-level dielectric layer 118A has more capability to decrease corrosion or mechanical damage to the underlying integrated circuits than the bottom-level dielectric layer 118B.

The semiconductor chip 100A may further include various device under test (DUT) structures 112 disposed on the circuit region 102 (not shown), as well as the CSR region 108. The DUT structures 112 are test structures in the form of resistors, capacitors, inductors, diodes, transistors, or the like. The DUT structure 112 shown in FIG. 4 is merely an example to illustrate the DUT structure 112 is on the CSR region 108. It is not intended to limit in which layer the DUT structure 112 is embedded. In this depicted embodiment, the DUT structure 112 is in a metallization layer $M_1$.

Referring to FIG. 4, a plurality of stacked metallization layers and via layers are formed and embedded in the dielectric layers 118. In one embodiment, the plurality of metallization layers include a top-most metal layer $M_T$ and other metal layers $M_1$-$M_4$ underlying the top-most metal layer $M_T$. Vertical via pillars $V_1$-$V_4$ interconnect every two metallization layers $M_1$-$M_T$. Each of the metallization layers includes a plurality of metal features in the circuit region 102, the enhanced region 105, the CSR region 108 and the seal ring region 104. In the circuit region 102, a first portion of the plurality of stacked metal features and via pillars provides interconnections between devices structures, circuits and inputs/outputs. In the seal ring region 104, a second portion of the plurality of stacked metal features and via pillars forms the seal ring structure 113 protects the circuit region 102 and the CSR region 108. In the CSR region 108, a third portion of the plurality of stacked metal features 114B and via pillars forms various probe pad structures $114_1$ and $114_2$. In the CSR region 108, the semiconductor chip 100A further includes a metal line 116 being in a same metallization layer (for example M1) of the metal feature 114B (also referred to as the first probe pad 114B) in one of the two probe pad structures $114_1$ and $114_2$. Through the metal line 116, the probe pad structures $114_1$ and $114_2$ electrically connect to the DUT structure 112. In FIG. 3, only two probe pad structures are shown for illustration purpose. It is not intended to limit the number of the probe pad structures. Note that, in FIG. 3, each DUT 112 is electrically connected to another DUT by way of probe pad structure $114_x$. In other embodiments, one or more DUT structures could be electrically isolated from other DUT structures by simply having probe pad structures that are electrically isolated from one another.

In the enhanced region 105, a fourth portion of the plurality of stacked metal features and via layers forms the enhanced structure 110. Such configuration of the enhanced structure 110 protects the integrated circuits in the circuit regions 102 and provides defense from dicing or packaging damage. The metallization layers and via layers may include aluminum, aluminum alloy, copper, copper alloy, titanium, titanium nitride, tantalum, tantalum nitride, tungsten, metal silicide, or combinations thereof.

In one embodiment, each probe pad structure has a top portion and a bottom portion. The top portion of a probe pad structure is embedded in the top-level dielectric layers 118A. The bottom portion of a probe pad structure is embedded in the bottom-level dielectric layers 118B. Advantageously, the configuration of the stacked metal features 114B (also referred to as the first probe pad 114B) and via pillars for the probe pad structures $114_1$-$114_3$ enables the measurement the DUT structure 112 for different dielectric layers when that layer is completed.

Still referring to FIG. 4, a passivation layer 122 is disposed over the multiple dielectric layers 118, the enhanced structure 110 and the probe pad structures $114_1$-$114_2$. The passivation layer 122 includes one or more layers, such as silicon nitride (SiN) or silicon oxynitride (SiON). The passivation layer 122 prevents or decreases moisture, mechanical, and radiation damage to the integrated circuits.

Next, a conductive layer is disposed over the passivation layer 122. Various depositing, patterning and etching processes may be used to form the structures of the top first probe pad 114A in the conductive layer. The top first probe pad 114A electrically contacts the underlying first probe pad 114B. The top first probe pad 114 enables performance of parametric tests on DUTs for the semiconductor chip 100A when all the semiconductor fabrication processes are completed in the wafer form as well as when the semiconductor chip 100A is sawed from the wafer. In one example, the conductive layer of the first probe pad 114 and the metal line 116 may include aluminum or aluminum alloy.

Still referring to FIG. 4, a polyimide layer 124 is disposed over the conductive layer and the passivation layer 122. The polyimide layer 124 serves as a stress buffer to reduce the stress transfer to the passivation layer 122 during an assembly process. An opening is defined in the polyimide layer 124 by patterning and etching processes to expose a portion of the top first probe pad 114A for the measurement of device parameters. Advantageously, the structure of semiconductor chip 100A keeps the integrity of the enhanced structure 110 and the seal ring structure 113 without reducing mechanical strength to prevent chip edge cracks.

Figure 5:
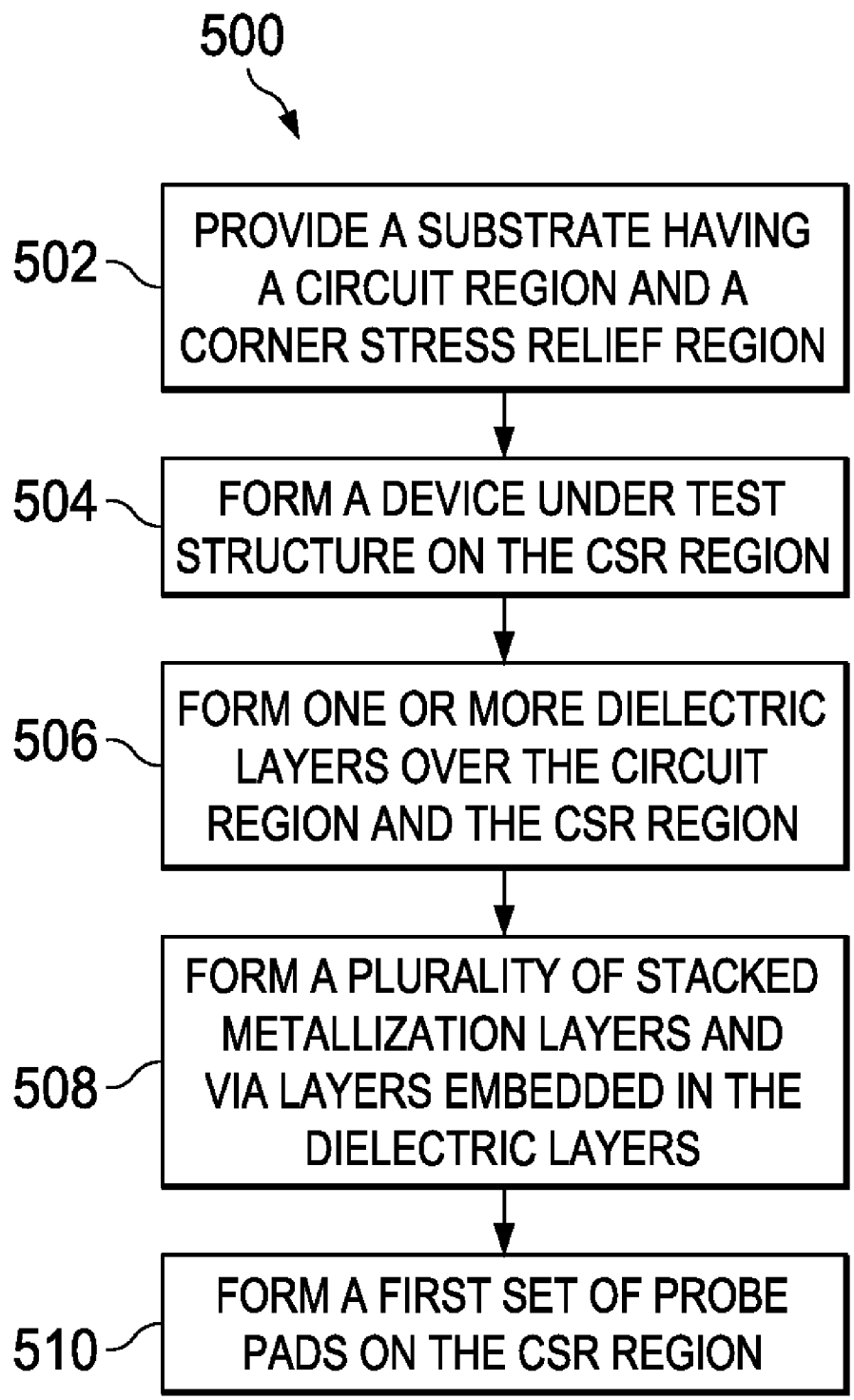
FIG. 5 is a flowchart of a method for fabricating an integrated circuit on a semiconductor chip at various stages according to embodiments of this disclosure.

Referring now to FIG. 5, method 500 for fabricating an integrated circuit on a semiconductor chip begins with block 502. At block 502, a semiconductor substrate is provided. The substrate has a circuit region, an enhanced region, a corner stress relief (CSR) region and a seal ring region. The seal ring region surrounds the circuit region, the enhanced region and the CSR region. The enhanced region is between the circuit region and the CSR region.

The method 100 continues with block 504 in which a device under test (DUT) structure is formed in the CSR region. A plurality of device structures may be formed on the circuit region.

The method 100 continues with block 506 in which one or more dielectric layer are formed over the circuit region, the enhanced region, the CSR region and the seal ring region. The dielectric layers are formed by deposition techniques, such as chemical vapor deposition (CVD) and/or a high density plasma (HDP) CVD process.

The method 100 continues with block 508 in which a plurality of stacked metallization layers and via layers are formed and embedded in the dielectric layers. The metallization layers and the via layers may be formed by various depositing, patterning and etching techniques. The metallization layers and via layers may include a conductive material such as aluminum, aluminum alloy, copper, copper alloy, or combinations thereof. One skilled in the art will recognize that steps 504 and 506 involve repeated steps of forming dielectric layers and embedding metallization layers and vias therein, and hence these methods steps of performed, in some embodiments, simultaneously. In one embodiment, interconnects in the circuit region, an enhanced structure in the enhanced region, a probe pad structure in the CSR region, and a seal ring structure in the seal ring region are all constructed in this operation. In the circuit region, a first portion of the plurality of stacked metallization layers and via layers provides interconnections between devices structures. In the seal ring region, a second portion of the plurality of stacked metallization layers and via layers forms the seal ring structure to protect the circuit region and the CSR region. In the CSR region, a third portion of the plurality of stacked metallization layers and via layers forms the probe pad structure. The probe pad structure electrically connects to the DUT structure. In the enhanced region, a fourth portion of the plurality of stacked metallization layers and via layers forms the enhanced structure.

The method 100 continues with block 510 in which a first set of probe pads is formed on the CSR region. A conductive layer is disposed over the dielectric layer and over the stacked metallization layers and via layers. Various depositing, patterning and etching processes may be used to form the structure of the first probe pad in the conductive layer. The conductive layer may include aluminum or aluminum alloy. In one example, the first probe pad contacts the underlying probe pad structure and electrically connects to the DUT structure.

Other layers, lines, vias and structures may also be provided before, during, or after the steps of method 500. The described process order is variable in further embodiments.

Various embodiments of the present disclosure may be used to improve previous manufacturing processes for a semiconductor chip having a probe pad. In some embodiments, a probe pad structure formed in a CSR region enables performance of parametric tests on DUTs after dicing process. The parametric tests on DUTs help to predict the yield of functional circuits in the circuit regions. In further embodiments, the probe pad structure in the CSR region does not consume extra space for functional integrated circuits and circuit routing in the circuit region. In another embodiment, the structure of semiconductor chip in this disclosure keeps the integrity of the enhanced structure without reducing mechanical strength to prevent chip edge cracks.

One form of the present disclosure involves a semiconductor chip. The semiconductor chip includes a corner stress relief (CSR) region. An enhanced structure connects sides of a seal ring structure to surround the CSR region. A device under test (DUT) structure is disposed on the CSR region. A set of probe pad structures is disposed on the CSR region. Two of the set of probe pad structures are electrically connected to the DUT structure.

Another form of the present disclosure involves a semiconductor chip. The semiconductor chip includes a plurality of stacked metal features and via pillars disposed in the semiconductor chip. The semiconductor chip includes a circuit region and a corner stress relief (CSR) region. The circuit region has a plurality of functional circuits. A seal ring structure surrounds the circuit region and the CSR region. An enhanced structure is disposed between the circuit region and the CSR region. A plurality of device under test (DUT) structures is disposed on the CSR region. A set of probe pad structures is disposed on the CSR region. Every two of the set of probe pad structures are electrically connected to one of the plurality of DUT structures. The circuit region comprises a first portion of the plurality of stacked metal features and via pillars to electrically connect the plurality of functional circuits. Each probe pad structure comprises a second portion of the plurality of stacked metal features and via pillars. The seal ring structure comprises a third portion of the plurality of stacked metal features and via pillars.

Still another form of the present disclosure involves a semiconductor chip. The semiconductor chip includes a corner stress relief (CSR) region. An enhanced structure connects sides of a seal ring structure to surround the CSR region. A device under test (DUT) structure is disposed on the CSR region. A set of probe pad structures is disposed on the CSR region. Two of the set of probe pad structures are electrically connect to the DUT structure. Multiple dielectric layers are disposed over the CSR region. The multiple dielectric layers comprise top-level dielectric layers and bottom-level dielectric layers. A dielectric constant $K_1$ of the bottom-level dielectric layers is less than a dielectric constant $K_2$ of the top-level dielectric layers. A top portion of each probe pad structure is embedded in top-level dielectric layers and a bottom portion of each probe pad structure is embedded in bottom-level dielectric layers.

Although exemplary embodiments have been described in detail, it should be understood that various changes, substitutions and alterations can be made herein without departing from the spirit and scope of the disclosure. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing that perform substantially the same function or achieve substantially the same result as the corresponding embodiments described herein may be utilized. Accordingly, the appended claims are intended to include within their scope such processes, machines, manufacture, compositions of matter, means, methods, or steps.

What is claimed is:

1. A semiconductor chip, comprising:
 a seal ring structure defining a periphery;
 a corner stress relief (CSR) region located within the periphery defined by the seal ring;
 an enhanced structure connecting sides of the seal ring structure to surround the CSR region;
 a device under test (DUT) structure disposed on the CSR region; and
 a set of probe pad structures disposed on the CSR region, wherein two of the set of probe pad structures electrically connect to the DUT structure.

2. The semiconductor chip of claim 1, wherein each probe pad structure comprises a plurality of stacked metal features and via pillars, wherein each metal feature occupies a substantially rectangular area having edges, each long edge having a length $D_1$ and each short edge having a length $D_2$, respectively, wherein the lengths $D_1$ and $D_2$ are within a range from about 10 μm to about 20 μm.

3. The semiconductor chip of claim 2, wherein the CSR region occupies a substantially right triangular area having perpendicular edges, the perpendicular edges having lengths of $L_1$ and $L_2$, respectively, and the lengths $D_1$ and $D_2$ are within a ratio from about 20% to about 50% of the lengths $L_1$ and $L_2$.

4. The semiconductor chip of claim 1, wherein the CSR region occupies a substantially right triangular area having perpendicular edges, the perpendicular edges having lengths of $L_1$ and $L_2$, respectively, wherein the lengths $L_1$ and $L_2$ are within a range from about 30 μm to about 100 μm.

5. The semiconductor chip of claim 1, wherein the set of probe pad structures comprises three probe pad structures.

6. The semiconductor chip of claim 1, further comprising a metal line connecting to the DUT structure, the metal line being in a same metallization layer of one of the two probe pad structures.

7. The semiconductor chip of claim 1, further comprising a second set of probe pads disposed on the seal ring structure.

8. A semiconductor chip, comprising:
a plurality of stacked metal features and via pillars disposed in the semiconductor chip;
a circuit region and a corner stress relief (CSR) region, the circuit region having a plurality of functional circuits;
a seal ring structure surrounding the circuit region and the CSR region;
an enhanced structure disposed between the circuit region and the CSR region;
a plurality of device under test (DUT) structures disposed on the CSR region;
a set of probe pad structures disposed on the CSR region, wherein every two of the set of probe pad structures electrically connects to one of the plurality of DUT structures; and
wherein the circuit region comprises a first portion of the plurality of stacked metal features and via pillars to electrically connect the plurality of functional circuits, each probe pad structure comprises a second portion of the plurality of stacked metal features and via pillars, and the seal ring structure comprises a third portion of the plurality of stacked metal features and via pillars.

9. The semiconductor chip of claim 8, wherein each metal feature in each probe pad structure occupies a substantially rectangular area having edges, each long edge having a length $D_1$ and each short edge having a length $D_2$, respectively, wherein the lengths $D_1$ and $D_2$ are within a range from about 10 μm to about 20 μm.

10. The semiconductor chip of claim 8, wherein the CSR region occupies a substantially right triangular area having perpendicular edges, the perpendicular edges having lengths of $L_1$ and $L_2$, respectively, and the lengths $D_1$ and $D_2$ are within a ratio from about 20% to about 50% of the lengths $L_1$ and $L_2$.

11. The semiconductor chip of claim 8, wherein the CSR region occupies a substantially right triangular area having perpendicular edges, the perpendicular edges having lengths of $L_1$ and $L_2$, respectively, wherein the lengths $L_1$ and $L_2$ are within a range from about 30 μm to about 100 μm.

12. The semiconductor chip of claim 8, further comprising a metal line connecting to the DUT structure being in a same metallization layer of one of the metal features of the probe pad structures.

13. The semiconductor chip of claim 8, further comprising a second set of probe pads disposed on the seal ring structure.

14. A semiconductor chip, comprising:
a seal ring structure defining a periphery;
a corner stress relief (CSR) region located within the periphery defined by the seal ring structure;
an enhanced structure connecting sides of the seal ring structure to surround the CSR region;
a device under test (DUT) structure disposed on the CSR region;
a set of probe pad structures disposed on the CSR region, wherein two of the set of probe pad structures electrically connect to the DUT structure; and
multiple dielectric layers disposed over the CSR region, the multiple dielectric layers comprising top-level dielectric layers and bottom-level dielectric layers, wherein a dielectric constant $K_1$ of the bottom-level dielectric layers is less than a dielectric constant $K_2$ of the top-level dielectric layers, wherein a top portion of each probe pad structure is embedded in top-level dielectric layers and a bottom portion of each probe pad structure is embedded in bottom-level dielectric layers.

15. The semiconductor chip of claim 14, wherein each probe pad structure comprises a plurality of stacked metal features and via pillars, wherein each metal feature occupies a substantially rectangular area having edges, each long edge having a length $D_1$ and each short edge having a length $D_2$, respectively, wherein the lengths $D_1$ and $D_2$ are within a range from about 10 μm to about 20 μm.

16. The semiconductor chip of claim 15, wherein the CSR region occupies a substantially right triangular area having perpendicular edges, the perpendicular edges having lengths of $L_1$ and $L_2$, respectively, and the lengths $D_1$ and $D_2$ are within a ratio from about 20% to about 50% of the lengths $L_1$ and $L_2$.

17. The semiconductor chip of claim 14, wherein the CSR region occupies a substantially right triangular area having perpendicular edges, the perpendicular edges having lengths of $L_1$ and $L_2$, respectively, wherein the lengths $L_1$ and $L_2$ are within a range from about 30 μm to about 100 μm.

18. The semiconductor chip of claim 14, wherein each of two probe pad structures comprises a plurality of stacked metal features and via pillars, and a metal line connecting to the DUT structure being in a same metallization layer of one of the metal features.

19. The semiconductor chip of claim 14, wherein the dielectric constant $K_1$ of the bottom-level dielectric layers is within a range from about 2.5 to about 3.8.

20. The semiconductor chip of claim 18, wherein the metal features comprise aluminum, copper or an alloy thereof.

* * * * *